United States Patent [19]

Fukunaga et al.

[11] Patent Number: 5,894,131
[45] Date of Patent: Apr. 13, 1999

[54] EXHAUST APPARATUS IN ION IMPLANTATION SYSTEM

[75] Inventors: Akira Fukunaga, Chigasaki; Tetsuo Komai, Fujisawa, both of Japan

[73] Assignee: Ebara Corporation, Tokyo, Japan

[21] Appl. No.: 08/848,356

[22] Filed: Feb. 7, 1997

[30] Foreign Application Priority Data

Feb. 9, 1996 [JP] Japan .................................. 8-048235

[51] Int. Cl.⁶ .................................................. H01J 37/317
[52] U.S. Cl. ............................. 250/492.21; 250/441.11
[58] Field of Search .......................... 250/492.21, 441.11

[56] References Cited

U.S. PATENT DOCUMENTS

| | | | |
|---|---|---|---|
| 4,059,293 | 11/1977 | Sipler | 285/236 |
| 5,062,771 | 11/1991 | Satou et al. | 417/201 |
| 5,314,541 | 5/1994 | Saito et al. | 118/725 |

FOREIGN PATENT DOCUMENTS

| | | |
|---|---|---|
| 55-154558 | 12/1980 | Japan . |
| 2-176392 | 7/1990 | Japan . |
| 05202474 | 8/1993 | Japan . |

OTHER PUBLICATIONS

European Search Report for Application No. 97102105.0 dated Jun. 24, 1997.

*Primary Examiner*—Jack I. Berman
*Attorney, Agent, or Firm*—Armstrong, Westerman, Hattori, McLeland & Naughton

[57] ABSTRACT

An exhaust apparatus in an ion implantation system for implanting impurities into a target substrate is used for evacuating an ion source chamber. The exhaust apparatus comprises at least one vacuum pump which does not use working oil for evacuating the ion source chamber, an atmospheric exhaust pipe connected to the vacuum pump for exhausting gas from the vacuum pump; and a device for introducing inert gas into at least one of the vacuum pump and the atmospheric exhaust pipe. The exhaust apparatus includes at least two vacuum pumps comprising a turbomolecular pump and a dry pump.

9 Claims, 4 Drawing Sheets

F I G. 3A
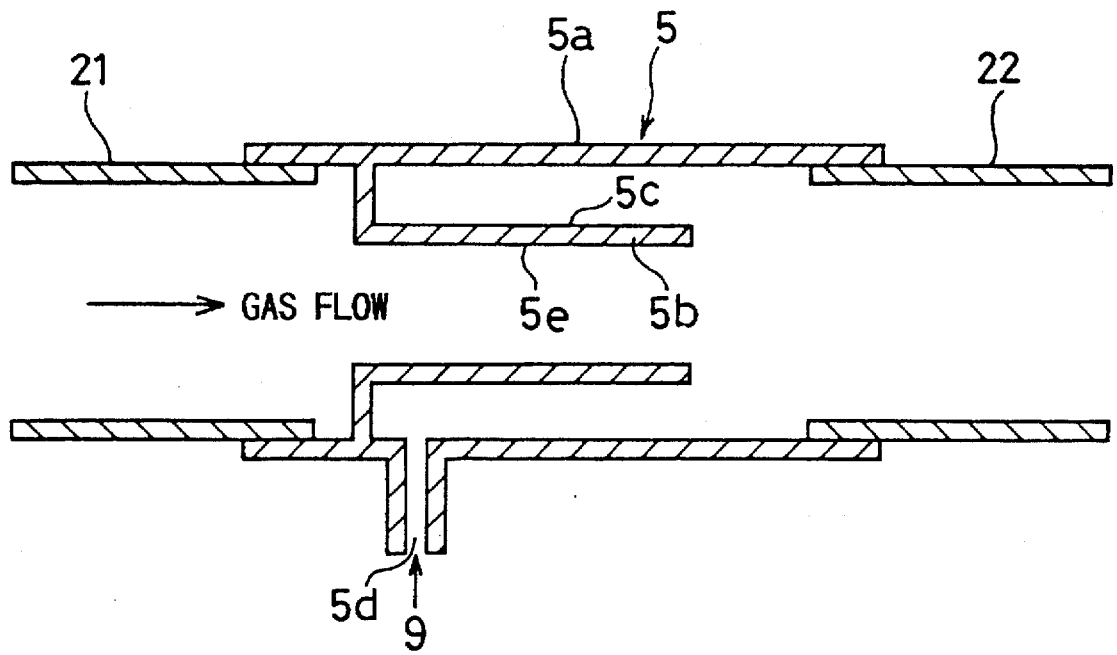
F I G. 3B
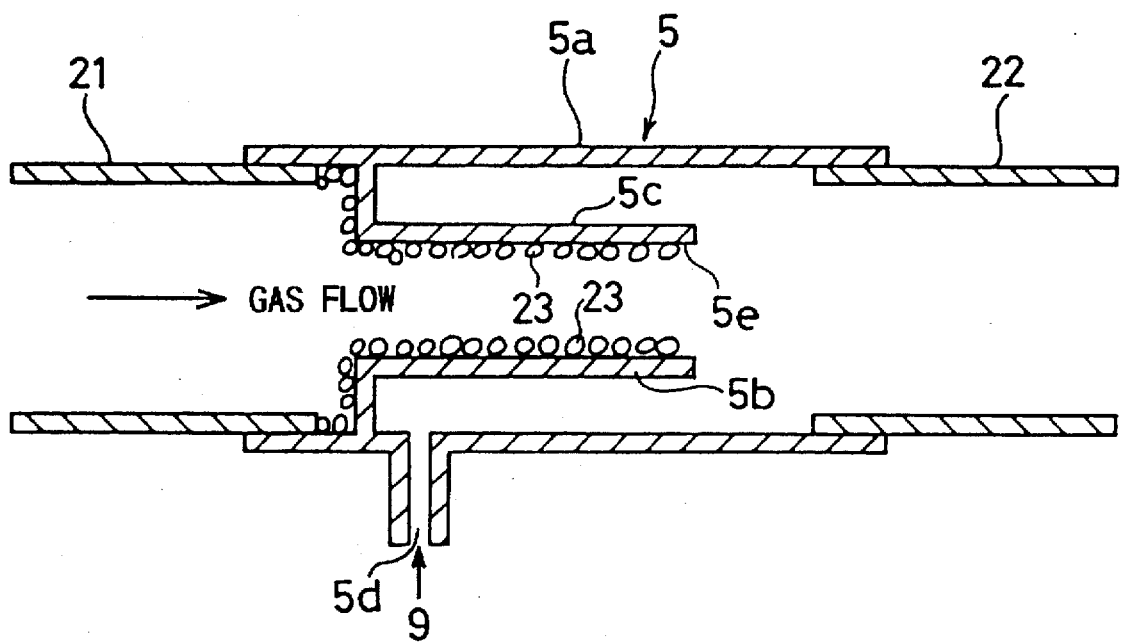

→ GAS FLOW

EXHAUST APPARATUS IN ION IMPLANTATION SYSTEM

BACKGROUND OF THE INVENTION

1. Field of the Invention

The present invention relates to an exhaust apparatus in an ion implantation system for implanting impurities into a target substrate to be processed, and more particularly to an exhaust apparatus in an ion implantation system which can lengthen service life thereof and facilitate maintenance thereof.

2. Description of the Related Art

Conventionally, as an exhaust apparatus for an ion source chamber in an ion implantation system, a combination of an oil diffusion pump and an oil rotary pump has been used. However, because of contamination of the ion implantation system caused by back streaming of oil vapor, the necessity of exchange of degraded oil and safety concerns during the exchange process of the degraded oil as well as the problem of disposal of the degraded oil, such a wet exhaust apparatus which uses oil has been replaced, in recent years, with a dry exhaust apparatus which does not use oil and are made up of a combination of a turbomolecular pump and a dry-sealed vacuum pump (hereinafter referred to as dry pump). Conversion of the wet exhaust apparatus to the dry exhaust apparatus creates a new problem that exhausted substances, particularly solid substances which have been trapped by the oil in the pumps are discharged in large amounts because there is no medium which traps such substances. Typical examples of the substances which are implanted into a substrate to be processed by the ion implantation system are arsenic, boron and phosphorous derived from solid sources. Even if these substances are derived from gaseous sources such as arsine, phosphine and boron trifluoride, most of these substances take the form of simple substance in the ion source chamber, and thus a large amount of solid particles comprised of arsenic, boron or phosphorous are contained in the exhaust gas from the ion source chamber as in the case of solid sources.

There has been no report or information about the behavior of such substances, however, our own studies have revealed the following:

Since boron has a melting point of 2300° C., boron takes the form of solid immediately in the ion source chamber, and although about 10% solid boron adheres to the inner wall of the ion source chamber, about 90% thereof is discharged from the system in the form of fine particles without adhering to the turbomolecular pump and the dry pump. As for arsenic, because the saturated vapor pressure of arsenic at a temperature of 160° C. corresponds to an internal pressure of $10^{-5}$ Torr in the ion source chamber, about 50% of arsenic is sublimed and adheres to the inner wall of the ion source chamber, and the remaining 50% thereof is sublimed and deposited within the exhaust apparatus before reaching the atmospheric exhaust pipe of the dry pump. As for phosphorous, it is likely to be in the form of white phosphorous which has a fairly high vapor pressure even at room temperature, and white phosphorous is sublimated and adheres to both the inner wall of the ion source chamber and the pumps as well as the region in the downstream side of the atmospheric exhaust pipe.

In this way, by using the dry exhaust apparatus, arsenic, phosphorous and boron adhere to various regions in the ion implantation system, which causes the following problems:

First, the adhesion of the above substances to an insulating exhaust pipe causes discharge, frequently resulting in the malfunction of the ion implantation system in a short term.

Second, highly reactive substances such as white phosphorous adhere to the exhaust pipe in the downstream side of the vacuum pump and in the atmospheric condition, thus necessitating hazardous maintenance work.

SUMMARY OF THE INVENTION

It is therefore an object of the present invention to provide an exhaust apparatus in an ion implantation system which can prevent substances such as arsenic, phosphorous and boron from adhering to an exhaust path in the exhaust apparatus to thus eliminate discharge in an insulating exhaust pipe of the apparatus, and can prevent highly reactive substances such as white phosphorous from adhering to an exhaust pipe in the downstream side of the vacuum pump and in the atmospheric condition to thus do away with hazardous maintenance work.

According to the present invention, there is provided an exhaust apparatus in an ion implantation system for implanting at least one of arsenic, boron and phosphorous into a substrate, comprising: at least one vacuum pump which is an oil-free pump for evacuating an ion source chamber; an atmospheric exhaust pipe disposed in the downstream side of said vacuum pump for exhausting gas from said vacuum pump; and means for introducing inert gas into at least one of said vacuum pump and said atmospheric exhaust pipe.

In this specification, the oil-free pump is defined as a pump which does not use oil in sealing portions thereof and/or has such a structure not as to allow oil used in the bearings or the like to flow vacuum side. That is, the oil-free pump does not contaminate vacuum developed thereby.

In a preferred aspect of the present invention, the exhaust apparatus includes at least two vacuum pumps comprising a turbomolecular pump and a dry pump. The exhaust apparatus further comprises a cold trap provided between the turbomolecular pump and the dry pump.

In a preferred aspect of the present invention, the exhaust apparatus further comprises an insulating exhaust pipe provided in the downstream side of the vacuum pump, and the insulating exhaust pipe has such a shape as to lengthen a creepage distance for insulation between both ends thereof.

In a preferred aspect of the present invention, the exhaust apparatus further comprises a dry type adsorption tower which can adsorb at least one of arsenic and phosphorous in the form of simple substance.

The above and other objects, features, and advantages of the present invention will become apparent from the following description of illustrative embodiments thereof in conjunction with the accompanying drawings.

BRIEF DESCRIPTION OF THE DRAWINGS

FIG. 3A is a cross-sectional view of an insulating exhaust pipe according to an embodiment of the present invention;

FIG. 3B is a cross-sectional view of the insulating exhaust pipe shown in FIG. 3A.

DESCRIPTION OF THE PREFERRED EMBODIMENTS

Figure 1:
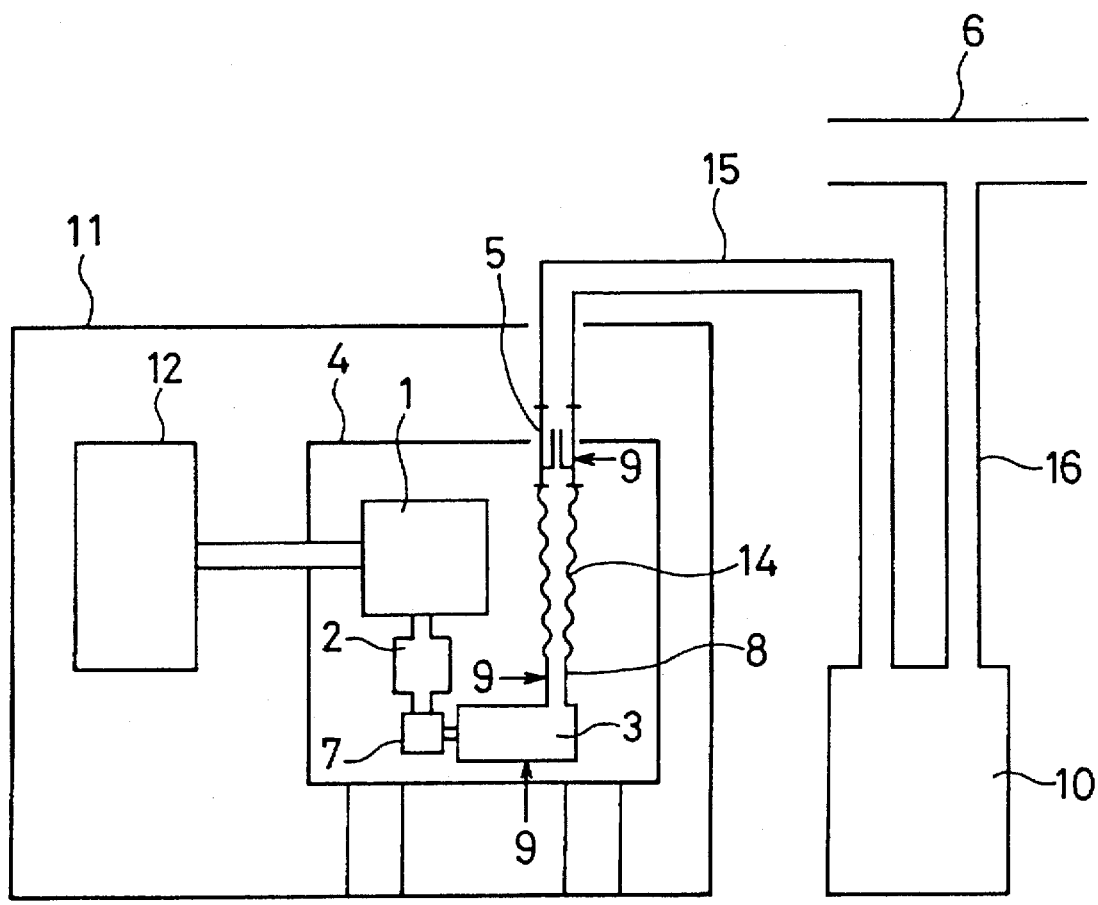
FIG. 1 is a schematic view showing an ion implantation apparatus incorporating an exhaust apparatus of the present invention.

A preferred embodiment of an exhaust apparatus in an ion implantation system will be described below with reference to the drawings. FIG. 1 shows an ion implantation apparatus incorporating a dry exhaust apparatus. As shown in FIG. 1, an ion implantation system 11 comprises an ion implantation chamber 12 which is connected to an ion source chamber 1. The ion source chamber 1 is connected to an inlet port of a turbomolecular pump 2. The turbomolecular pump 2 has a discharge port which is connected to a dry pump 3 through a cold trap 7.

The dry pump 3 has an atmospheric exhaust pipe 8 which is connected to an insulating exhaust pipe 5 made of synthetic resin through a flexible pipe 14. The insulating exhaust pipe 5 is connected to a dry type adsorption tower 10 through a duct 15. The dry type adsorption tower 10 is connected through an outlet duct 16 to a main duct 6 installed in the plant. The ion source chamber 1, the turbomolecular pump 2 and the dry pump 3 are housed in a high-voltage insulating container 4.

In the above structure, the ion source chamber 1 is evacuated by a combination of the turbomolecular pump 2 and the dry pump 3 to a degree of an ultrahigh vacuum. The gas discharged from the dry pump 3 is discharged through the insulating exhaust pipe 5 made of synthetic resin and the dry type adsorption tower 10 to the main duct 6 installed in the plant.

In the exhaust apparatus of the ion implantation system described above, by introducing an inert gas 9 into the dry pump 3, the atmospheric exhaust pipe 8 and the insulating exhaust pipe 5, phosphorus and boron in the form of simple substance are prevented from adhering to the insulating exhaust pipe 5. Further, even if arsenic, phosphorus and boron in the form of simple substance adhere to the insulating exhaust pipe 5, the dielectric breakdown is prevented from occurring by lengthening the creepage distance for insulation between both ends of the cylindrical insulating exhaust pipe 5, and by introducing the inert gas 9. Further, since the dry type adsorption tower 10 is provided between the insulating exhaust pipe 5 and the main duct 6, phosphorus and arsenic in the form of simple substance are adsorbed by the adsorption tower 10.

The cold trap 7 may have any structure as long as the trap can be operated by cooling water which is generally used in the plant. The dry pump may comprise a Roots vacuum pump, a screw vacuum pump, a claw type dry vacuum pump and the like. The dry type adsorption tower 10 may include adsorption medium comprising carriers impregnated with an oxidizing agent such as iron chloride or potassium permanganate, or metallic oxide in the form of grains. The dry type adsorption tower may comprise any other structure as long as phosphorus and arsenic are removed.

In the case of phosphorus, the most likely state is white phosphorus, and its vapor pressure is about 0.04 Torr at normal temperature of 25° C., or about 1 Torr at a temperature of 78° C. Therefore, it is possible to prevent solid phosphorus from being deposited in the pumps by setting the temperature of the casing, the amount of inert gas introduced into the system, and the pressures in the pumps to respective suitable values.

However, in the actual ion implantation system, there are some cases in which phosphorus adheres to the atmospheric exhaust pipe 8 or the insulating exhaust pipe 5, and the dielectric breakdown occurs to thus lead to the malfunction of the ion implantation apparatus and the necessity of maintenance work of the apparatus. Therefore, the inert gas 9 is introduced into the dry pump 3 and the atmospheric exhaust pipe 8 to lower the partial pressure of phosphorus thereby preventing the deposition of solid phosphorus. As inert gas, nitrogen, argon, helium or like may be used, but from an economical viewpoint, nitrogen is preferable.

In the case of arsenic, its vapor pressure is $10^{-12}$ Torr at normal temperature of 25° C., and in terms of the equilibrium theory, it is natural that most of arsenic be sublimed and deposited in the ion source chamber. However, it is practically confirmed that arsenic is sublimed and deposited in the turbomolecular pump, the dry pump, and the exhaust pipe in the downstream side of the dry pump. In this case, it is difficult to lower the partial pressure of arsenic to a pressure lower than its vapor pressure, even if arsenic is diluted with inert gas, and hence it is desirable that arsenic is positively sublimed and deposited. In the case of accelerating deposition of arsenic, it is desirable that the deposition of arsenic is carried out at the region nearer to the ion source chamber so that the downstream side of the deposited region will have less deposition and the frequency in inspection and maintenance of the exhaust apparatus can be reduced.

However, it is not preferable to provide a certain device which accelerates the deposition of arsenic between the ion source chamber and the turbomolecular pump because the exhaust capacity of the turbomolecular pump is lowered.

Therefore, in the present invention, the cold trap 7 is provided between the turbomolecular pump 2 and the dry pump 3 to sublime and deposit arsenic.

The structure and dimension of the cold trap 7 may be selected to meet the exhaust characteristics of the pumps, and other design limitations such as an available space for installation thereof. Although various medium may be used as cooling medium, if the cold trap 7 is to be placed inside the insulating container 4, it is preferable to use cooling water available in the apparatus. In addition to installation of the cold trap 7, by introducing the inert gas 9 into the dry pump 3 and the atmospheric exhaust pipe 8, the deposited solid particles can be conveyed by gas flow to thus reduce the amount of arsenic to be deposited in the regions of the system in the downstream side of the dry pump.

Since boron has a melting point of 2300° C., about 90% of boron introduced into the ion source chamber 1 is discharged in the form of fine particles. A trace amount of arsenic which has not been trapped by the cold trap 7 and a trace amount of phosphorus which has been deposited on the exhaust pipe or the like adhere to the insulating exhaust pipe 5 to lead to the dielectric breakdown.

Figure 2A:
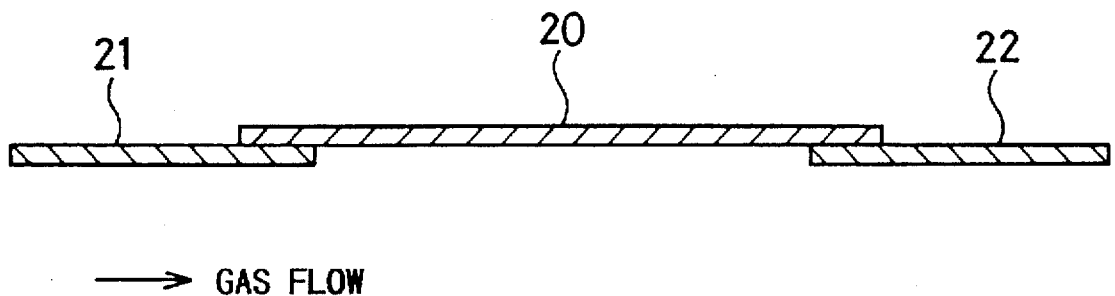
FIG. 2A is a cross-sectional view of a conventional insulating exhaust pipe.
Figure 2B:
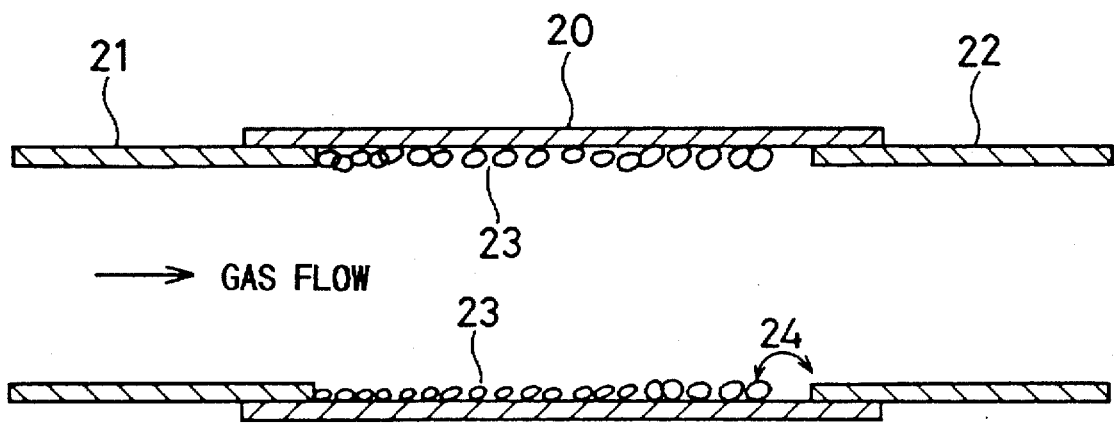
FIG. 2B is a cross-sectional view of the conventional insulating exhaust pipe shown in FIG. 2A.

FIGS. 2A and 2B shows a conventional insulating exhaust pipe 20 which comprises a cylindrical pipe. As shown in FIG. 2A, a pipe 21 disposed at the side of the high-voltage insulating container 4 and a pipe 22 disposed at the side of the main duct 6 are connected to the insulating exhaust pipe 20, respectively. As shown in FIG. 2B, when solid elements 23 adhere to the inner surface of the insulating exhaust pipe 20 and are deposited, the discharge 24 occurs in the pipes.

FIGS. 3A and 3B show an insulating exhaust pipe according to an embodiment of the present invention. As shown in FIG. 3A, the insulating exhaust pipe 5 comprises an outer pipe 5a having end portions connected to the pipes 21 and 22, respectively, and an inner pipe 5b disposed inside the outer pipe 5a and having a base portion connected to the outer pipe 5a. This structure of the insulating exhaust pipe 5 allows to lengthen the creepage distance for insulation between the regions of different electrical potentials. Another design feature is to provide an inlet port 5d for introducing the inert gas 9 to prevent the solid elements 23 from adhering to the insulating surface 5c. The pipe 21 is disposed at the side of the high-voltage insulating container 4, and the pipe 22 is disposed at the side of the main duct 6.

As shown in FIG. 3B, even if the solid elements 23 adhere to a particle adhesion surface 5e, they are not allowed to adhere to the insulating surface 5c, thus preventing the dielectric breakdown from occurring. The inert gas 9 may comprise any one of nitrogen, argon, and helium.

Figure 4:
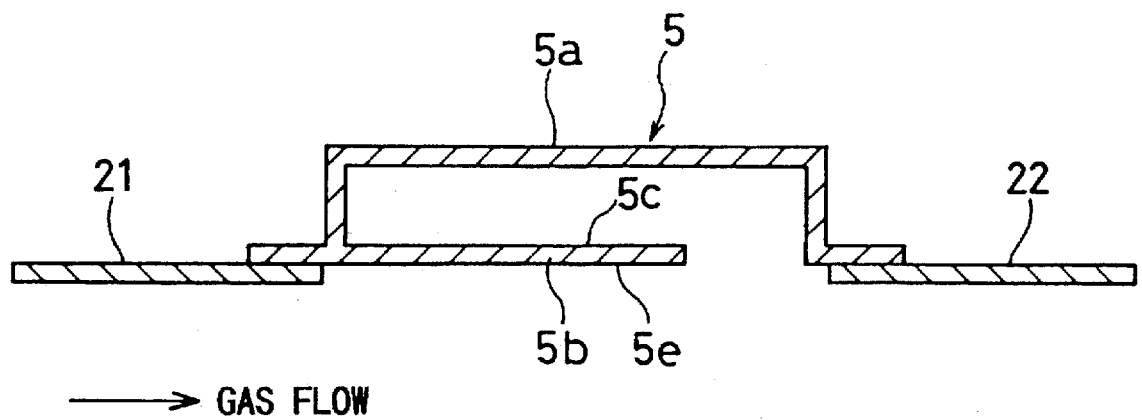
FIG. 4 is a cross-sectional view of an insulating exhaust pipe according to another embodiment of the present invention.
Figure 4:
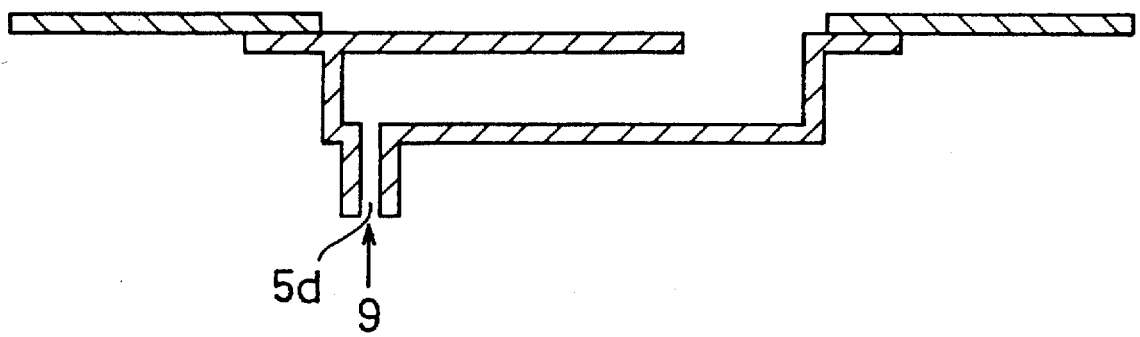

FIG. 4 shows an insulating exhaust pipe according to another embodiment of the present invention. The insulating pipe 5 comprises an outer pipe 5a and an inner pipe 5b as in the embodiment of FIGS. 3A and 3B. In this embodiment, the outer pipe 5a of the insulating exhaust pipe 5 has an outside diameter larger than those of the pipes 21 and 22. The inner pipe 5b of the insulating exhaust pipe 5 has substantially the same diameter as the pipes 21 and 22. In this embodiment, gas flow is not restricted by the inner pipe 5b.

As described above, according to one aspect of the present invention, there is provided an exhaust apparatus in an ion implantation system for implanting phosphorous by using solid phosphorous or gaseous phosphorous compound such as phosphine as source material into a substrate, the exhaust apparatus comprising: a turbomolecular pump; a dry pump; and an atmospheric exhaust pipe. In the exhaust apparatus, inert gas is introduced into the dry pump and the atmospheric exhaust pipe so that a vapor pressure of phosphorous in the form of simple substance in the vacuum pump and the atmospheric exhaust pipe is not more than a saturated vapor pressure thereof. Therefore, phosphorous does not adhere to the exhaust pipe in the downstream side of the dry pump, and discharge in the insulating exhaust pipe can be prevented and the safety of maintenance for the exhaust pipe can be ensured.

According to another aspect of the present invention, there is provided an exhaust apparatus in an ion implantation system for implanting arsenic by using solid arsenic or gaseous arsenic compound such as arsine as source material into a substrate, the exhaust apparatus comprising: a turbomolecular pump; a dry pump; and a cold trap provided between the turbomolecular pump and the dry pump. In the exhaust apparatus, inert gas is introduced into the dry pump and the atmospheric exhaust pipe, and the amount of arsenic to be deposited can be reduced and the interval of maintenance of the insulating exhaust pipe and other parts can be prolonged.

According to another aspect of the present invention, there is provided an exhaust apparatus in an ion implantation system for implanting arsenic, phosphorous and boron by using solid element or gaseous compound as source material into a substrate, the exhaust apparatus comprising: a high-voltage insulating container; a vacuum pump in the high-voltage insulating container; and an insulating exhaust pipe for keeping insulation between the high-voltage insulating container and equipments in the plant. In the exhaust apparatus, the insulating exhaust pipe has such a shape as to lengthen a creepage distance for insulation between both ends thereof, even if solid elements adhere to the inner surface of the insulating exhaust pipe and are deposited. Further, inert gas is introduced into the insulating exhaust pipe, and thus discharge in the insulating exhaust pipe can be prevented and the operating rate of the ion implantation system can be enhanced.

Further, since there is provided a dry type adsorption tower in the downstream side of the dry pump which can adsorb phosphorous and arsenic in the form of simple substance, those substances discharged from the pumps can be removed and the safety of the working environment can be ensured.

Although certain preferred embodiment of the present invention has been shown and described in detail, it should be understood that various changes and modification may be made therein without departing from the scope of the appended claims.

What is claimed is:

1. An exhaust apparatus in an ion implantation system for implanting at least one of arsenic, boron, and phosphorous into a substrate, comprising:

at least one vacuum pump which is an oil-free pump for evacuating an ion source chamber;

an atmospheric exhaust pipe disposed in the downstream side of said vacuum pump for exhausting gas from said vacuum pump; and means for introducing inert gas into at least one of said vacuum pump and said atmosphere exhaust pipe to control a partial pressure of a vapor to be below a predetermined value in at least one of said vacuum pump and said atmospheric exhaust pipe.

2. An apparatus according to claim 1, wherein said at least one vacuum pump is capable of evacuating said ion source chamber to a degree of an ultrahigh vacuum.

3. An exhaust apparatus according to claim 1, wherein said exhaust apparatus includes at least two vacuum pumps comprising a turbomolecular pump and a dry pump which are oil-free pumps.

4. An exhaust apparatus according to claim 3, further comprising a cold trap provided between said turbomolecular pump and said dry pump.

5. An exhaust apparatus according to claim 1, further comprising a dry type adsorption tower which can adsorb at least one of arsenic and phosphorous in the form of simple substance.

6. An apparatus according to claim 1, wherein said introducing means controls said partial pressure of said vapor to be not more than a saturated pressure of said vapor.

7. An exhaust apparatus in an ion implantation system for implanting at least one of arsenic, boron, and phosphorous into a substrate, comprising:

at least one vacuum pump which is an oil-free pump for evacuating an ion source chamber;

an atmospheric exhaust pipe disposed in the downstream side of said vacuum pump for exhausting gas from said vacuum pump;

means for introducing inert gas into at least one of said vacuum pump and said atmosphere exhaust pipe; and an insulating exhaust pipe disposed in the downstream side of said vacuum pump, said insulating exhaust pipe having such a shape as to lengthen a creepage distance for insulation between opposite ends of said insulating exhaust pipe.

8. An exhaust apparatus according to claim 7, wherein said insulating exhaust pipe comprises an outer pipe, and an inner pipe provided inside said outer pipe and having a base portion connected to said outer pipe and a free end defining an opening.

9. An exhaust apparatus according to claim 7, wherein inert gas is introduced into said insulating exhaust pipe.

* * * * *